United States Patent
Fishman et al.

(10) Patent No.: US 7,197,061 B1
(45) Date of Patent: Mar. 27, 2007

(54) DIRECTIONAL SOLIDIFICATION OF A METAL

(75) Inventors: Oleg S. Fishman, Maple Glen, PA (US); Joseph T. Belsh, Mount Laurel, NJ (US); Bernard M. Raffner, Maple Glen, PA (US); Prabhu N. Satyen, Voorhees, NJ (US)

(73) Assignee: Inductotherm Corp., Rancocas, NJ (US)

( * ) Notice: Subject to any disclaimer, the term of this patent is extended or adjusted under 35 U.S.C. 154(b) by 0 days.

(21) Appl. No.: 10/823,856

(22) Filed: Apr. 14, 2004

Related U.S. Application Data (60) Provisional application No. 60/463,990, filed on Apr. 19, 2003.

(51) Int. Cl.
*F27D 3/00* (2006.01)
(52) U.S. Cl. ...................................... 373/142; 373/138
(58) Field of Classification Search ......... 373/138–154
See application file for complete search history.

(56) References Cited

U.S. PATENT DOCUMENTS

| | | | |
|---|---|---|---|
| 3,331,909 A * | 7/1967 | Kasper | 373/150 |
| 5,059,762 A | 10/1991 | Simcock | |
| 5,109,389 A * | 4/1992 | Stenzel | 373/156 |
| 5,135,781 A * | 8/1992 | Schluckebier et al. | 427/431 |
| 5,349,167 A | 9/1994 | Simcock | |
| 5,416,796 A * | 5/1995 | Fukuzawa et al. | 373/156 |
| 5,523,631 A | 6/1996 | Fishman et al. | |
| 6,307,875 B1 * | 10/2001 | Tsuda et al. | 373/142 |
| 6,798,822 B2 * | 9/2004 | Fishman et al. | 373/146 |

* cited by examiner

*Primary Examiner*—Tu Hoang
(74) *Attorney, Agent, or Firm*—Philip O. Post (57) ABSTRACT

A molten material can be heated, melted and directly solidified in a single vessel. Induction heating and melting of the molten material is achieved by magnetically coupling the field produced by current flow in a plurality of induction coils surrounding the vessel with either the molten material in the vessel, or a susceptor surrounding molten material in the vessel. Current flow is selectively removed from the plurality of induction coils, and a cooling medium surrounding the vessel, such as water flowing through hollow induction coils, solidifies the molten metal into a highly purified crystalline solid.

22 Claims, 7 Drawing Sheets

DIRECTIONAL SOLIDIFICATION OF A METAL

CROSS REFERENCE TO RELATED APPLICATIONS

This application claims the benefit of U.S. Provisional Application No. 60/463,990 filed Apr. 19, 2003, hereby incorporated herein by reference.

FIELD OF THE INVENTION

The present invention is related to directional solidification of a metal wherein magnetic induction heating is used to heat the metal prior to solidification.

BACKGROUND OF THE INVENTION

The metal silicon is used as a raw material in various applications based upon its purity. Regular grade silicon is nominally 99% pure silicon and hyperpure silicon is nominally 99.99% silicon. Hyperpure silicon is used extensively for the production of solid state devices and silicones. One method of producing crystalline silicon with purity up to hyperpure silicon is known as directional solidification. In this method a column of molten silicon with impurities is slowly cooled from the bottom upwards. With appropriate process parameters, crystalline silicon forms in the cooled region as most impurities remain in the molten portion of the mass. At the end of the process, the cooled mass is appropriately trimmed to remove outer regions of impurities and the crystalline silicon mass is further processed, for example, cut into thin wafers for use in the production of semiconductors. U.S. Pat. No. 6,136,091, U.S. Pat. No. 5,182,091, U.S. Pat. No. 4,243,471 and U.S. Pat. No. 4,218,418 disclose various methods of producing crystalline silicon by directional solidification.

BRIEF SUMMARY OF THE INVENTION

In one aspect, the invention is apparatus for and method of producing a high purity metal by providing a vessel with a plurality of induction coils surrounding the exterior of the vessel. Each of the plurality of induction coils is connected to one or more ac power supplies in a manner by which power may be selectively decreased and removed from each of the plurality of induction coils. Low purity metal in molten, semi-solid and solid state is placed in the vessel and heated by magnetic induction into a molten mass when ac current flows through each of the plurality of induction coils. Optionally the vessel may include means for removal of gross impurities from the molten mass prior to the directional solidification process, such as bubbling a suitable gas through the molten mass to bond impurities to the gas. Power to each of the plurality of induction coils is selectively decreased in a manner by which the molten mass begins to solidify at one end with progressive solidification to the other end. A cooling medium, such as cooling water in each of the plurality of induction coils, assists in the solidification of the molten mass. In other examples of the invention, the magnetic fields produced by the plurality of induction coils may be coupled with an electrically conductive susceptor placed in the vessel, or incorporated in the vessel, rather than with the molten mass in the vessel.

These and other aspects of the invention are set forth in the specification.

BRIEF DESCRIPTION OF THE DRAWINGS

The figures, in conjunction with the specification and claims, illustrate one or more non-limiting modes of practicing the invention. The invention is not limited to the illustrated layout and content of the drawings.

FIG. 3($a$) through FIG. 3($f$) is one example of a time-power management scheme for supplying electrical power to the induction coils used with a system for directional solidification of a metal of the present invention.

DETAILED DESCRIPTION OF THE INVENTION

Figure 1:
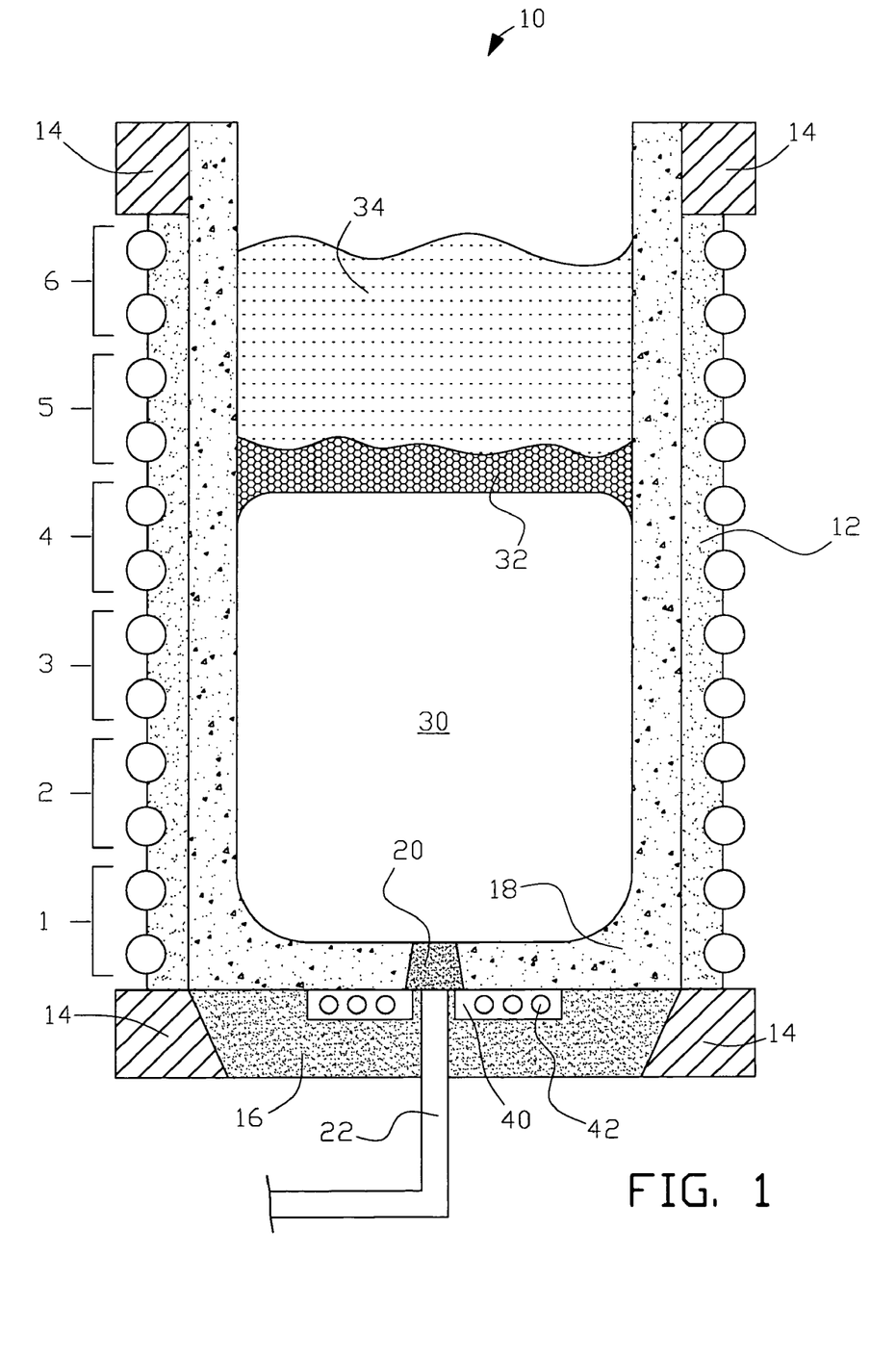
FIG. 1 is a cross sectional diagram of one example of a system for directional solidification of a metal of the present invention.
Figure 2:
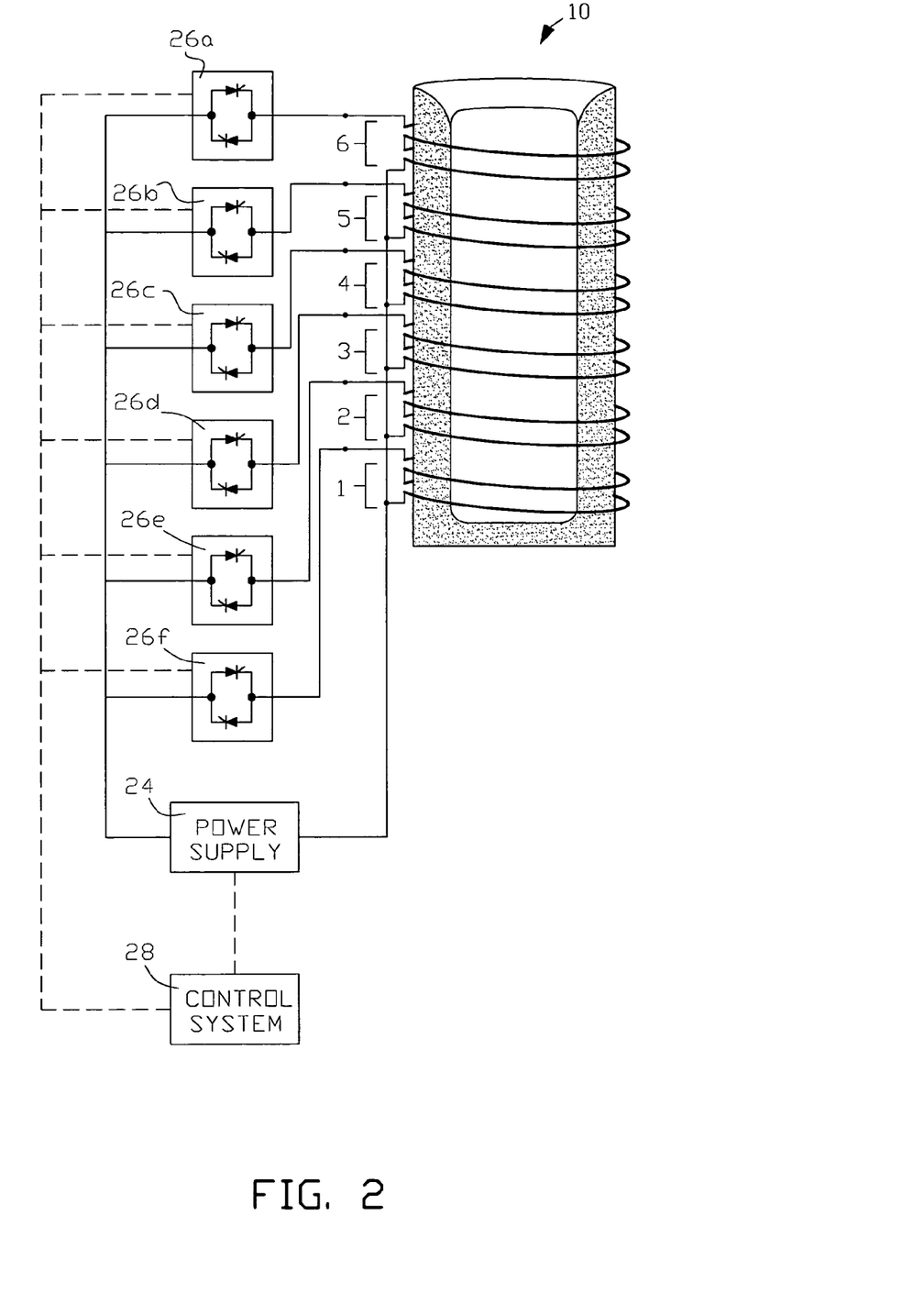
FIG. 2 is a simplified electrical diagram of one example of a power source and power distribution for use with the system for directional solidification of a metal of the present invention.

There is shown in FIG. 1 and FIG. 2 one example of a system for directional solidification of a metal, such as, but not limited to, silicon. Vessel 10 comprises a plurality of induction coils around a chamber, or vessel, for holding a molten mass of the metal. In this non-limiting example of the invention, each of six induction coils (coil 1 through coil 6) comprises a two-turn coil. In other examples of the invention, the number of individual coils and the number of coil turns in each coil can vary. The plurality of coils are held in place by suitable structural elements such as grout 12, blocks 14 and grout base 16 as shown in FIG. 1. Not shown in the figures are magnetic shunts that are typically placed around the outer circumference of the coils to support the coils and contain the magnetic fields produced when current flows through the coils. Also not shown is an outer container element for the vessel. Refractory 18, typically a particulate refractory material, is packed and sintered to form the inner walls of the chamber in which the molten metal will be placed. Typically the inner layer of refractory is sintered to a solid glass-like material while the outer regions of the refractory remain in particulate form.

The metal solidification process begins with a vessel holding molten metal. To reach that stage, molten metal may be poured into the vessel, or a small amount of molten metal heel may be placed in the vessel, and solid forms of metal (e.g. particulate, ingots and the like) may be added to the vessel for induction melting in the vessel. Prior to the beginning of the metal solidification process, one or more treatment processes may be performed on the molten metal in the vessel. For example optional porous plug 20 may be provided in the bottom of refractory 18 so that a pressurized gas, from a suitable source, may be injected into the molten metal via conduit 22. The gas is selected for bonding with impurities in the molten metal so that as the gas bubbles through the molten metal it removes impurities to the surface of the molten metal in the vessel where they evaporate into the air, or skimmed off the surface. This type of gas purging of a molten metal is one method of gross impurity removal prior to beginning the directional solidification process that produces a highly purified solid metal.

FIG. 2 illustrates one example of a power source and power distribution system to the six induction coils surrounding vessel 10. Power supply 24 is a suitable ac power source for providing power to each of the induction coils. In this non-limiting example of the invention, power is supplied to each induction coil by a suitable switching means, such as, but not limited to, back-to-back solid state switches 26a through 26f as shown in FIG. 2. Each coil has a common return power line to power supply 24. Control system 28 controls the output power of the power supply, and opened (non-conducting) and closed (conducting) states of the solid state switches as further described below.

FIG. 3(a) through FIG. 3(f) illustrate one non-limiting example of a time-power management scheme executed by control system 28 to achieve directional solidification. In all of these figures, the x-axis represents time, and the y-axis represents normalized output power of power supply 24. Power control may be accomplished by changing the supply's output voltage magnitude; output current magnitude; or a combination of output voltage and current magnitudes. One or more of the six induction coils receives output power from supply 24 for a time period within a power supply cycle period, which is identified as $T_{CYCLE}$ in the figures. In the first series of power supply cycle periods shown in FIG. 3(a) all six coils receive power in each cycle period for time period $T_{CP1}$. While $T_{CP1}$ is equal for all coils, in other examples of the invention, coil power periods may vary. The coil power switching scheme in FIG. 3(a) cyclically repeats as shown for $T_{CYCLE}$ until time $T_1$. At this time, the power switching scheme continues in FIG. 3(b) wherein induction coil 1 receives no power in a power supply cycle period. In this second series of power supply periods, coils 2 through 6 receive power in each cycle period for time period $T_{CP2}$. Since $T_{CP2}$ is greater than $T_{CP1}$, output power is proportionately reduced (normalized 0.833 output power since time period $T_{CP2}$ is 1.2 times longer than $T_{CP1}$) to maintain the same amount of electrical energy to each induction coil. The coil power switching scheme in FIG. 3(b) cyclically repeats as shown for $T_{CYCLE}$ until time $T_2$. Similarly progressive power switching schemes are sequentially executed as illustrated in FIG. 3(c) through FIG. 3(f) wherein one additional coil receives no power in each progressive power supply cycle shown in each figure. In this fashion inductive heating of the molten metal in the vessel progressively decreases from the bottom to the top of the molten mass.

A cooling medium is selectively applied around the exterior of the vessel to assist in directional solidification of the molten metal. A suitable cooling medium can be provided in combination with the induction coils. For example the induction coils may be hollow induction coils with a cooling medium, such as water, flowing through the hollow coils. In this arrangement the cooling medium serves the dual purpose of keeping the coils cool when they are conducting current (primarily cooling of coils from $I^2R$ losses) and cooling the molten mass after power is selectively removed from the coils with a suitable time-power management scheme as executed by control system 28.

FIG. 1 also illustrates an optional bottom cooling plate 40 that may be provided at the bottom of the vessel. In this non-limiting example of the invention, the cooling plate is annular in shape and fitted around conduit 22. One or more cooling passages 42 are provided in the cooling plate to provide a means for circulating a cooling medium in the plate to remove heat from the solidifying molten mass. In this arrangement bottom cooling cools the solidifying molten mass from the bottom while the side wall cooling medium, such as cooling water in hollow induction coils, cools the solidifying molten mass from the sides.

Figure 3A:
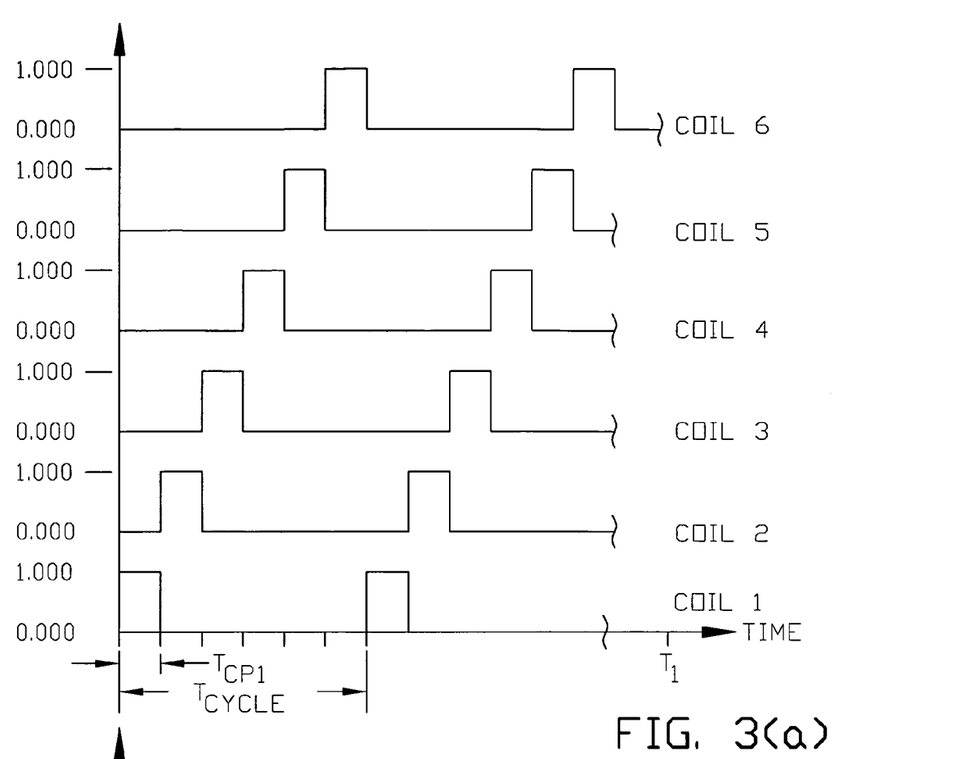
Figure 3B:
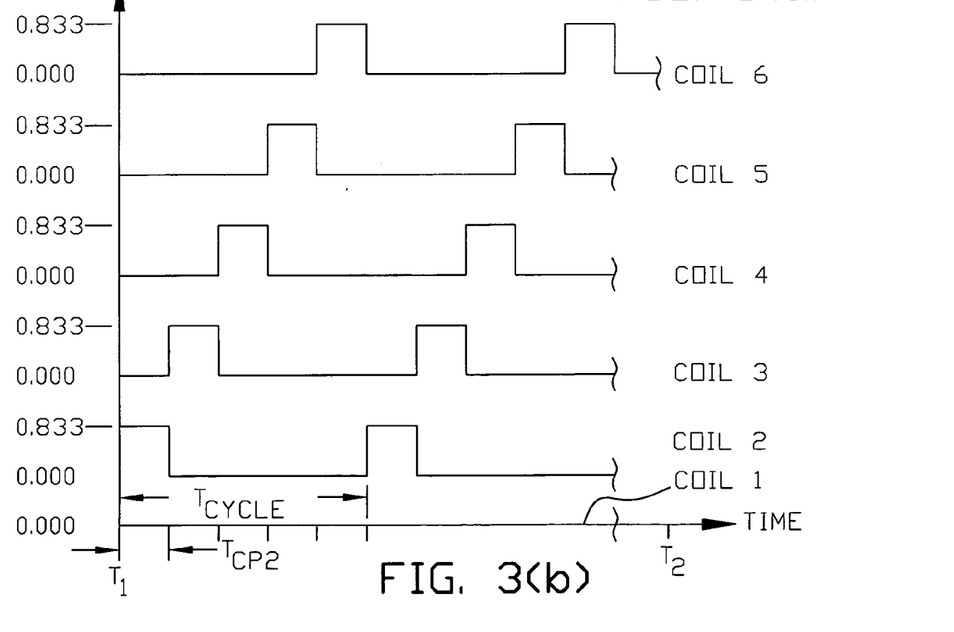
Figure 3C:
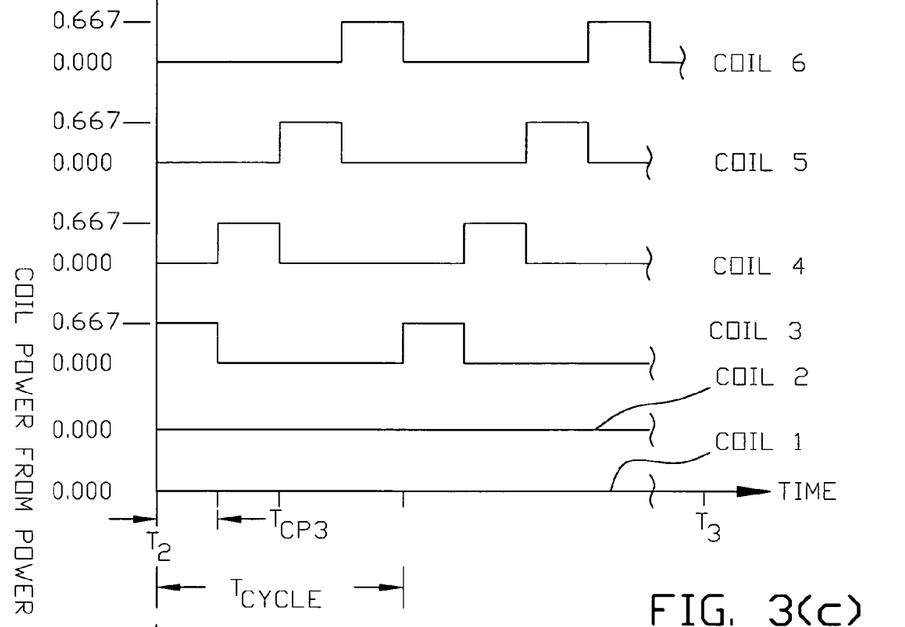
Figure 3D:
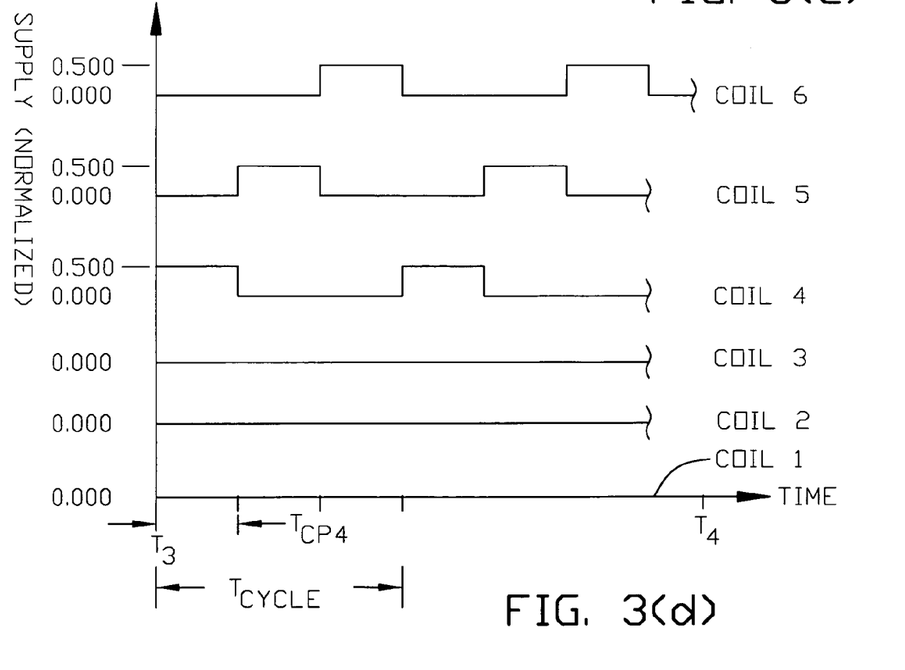
Figure 3E:
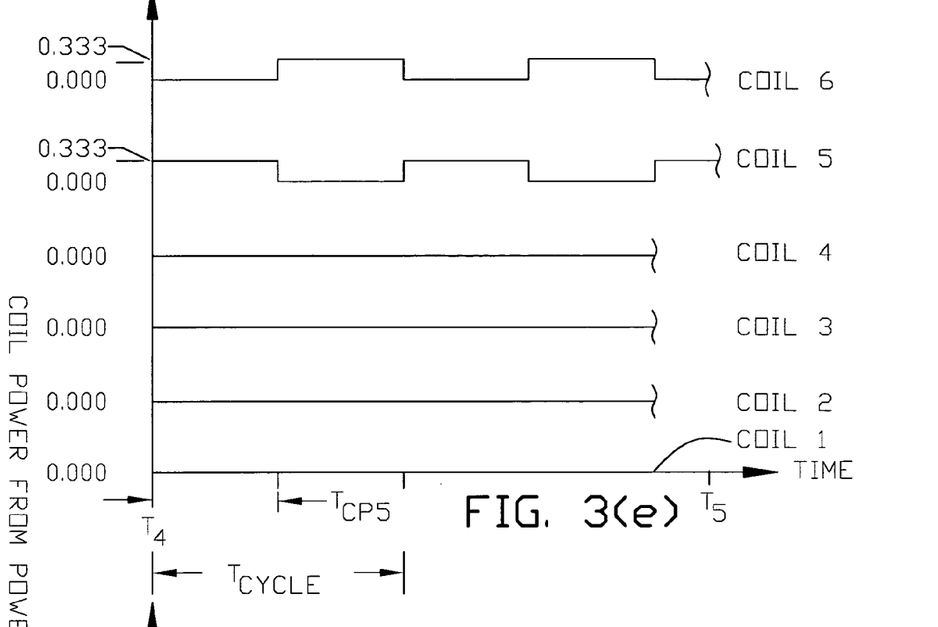
Figure 3F:
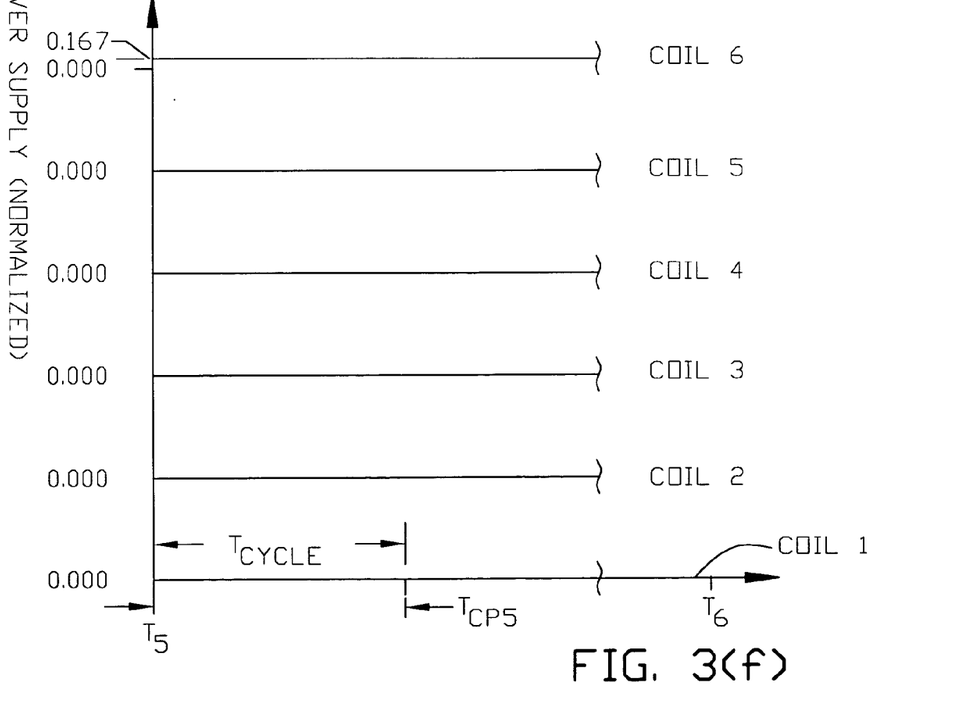

FIG. 1 illustrates a directional solidification process wherein solidification is more than half completed. For example the time-power management scheme may be operating in the power switching scheme illustrated in FIG. 3(e) wherein induction coils 1 through 4 are not receiving power and the molten metal in the vessel has been directionally solidified into a highly purified crystalline metal solid 30. Impurities 32 are disposed primarily above the metal solid and remaining molten metal 34 remains to be purified. After the required induction heating of the molten mass with all coils being powered as shown in FIG. 3(a), the time period for each coil power switching scheme illustrated in FIG. 3(b) through FIG. 3(e) may be as long as one or more days.

Figure 4:
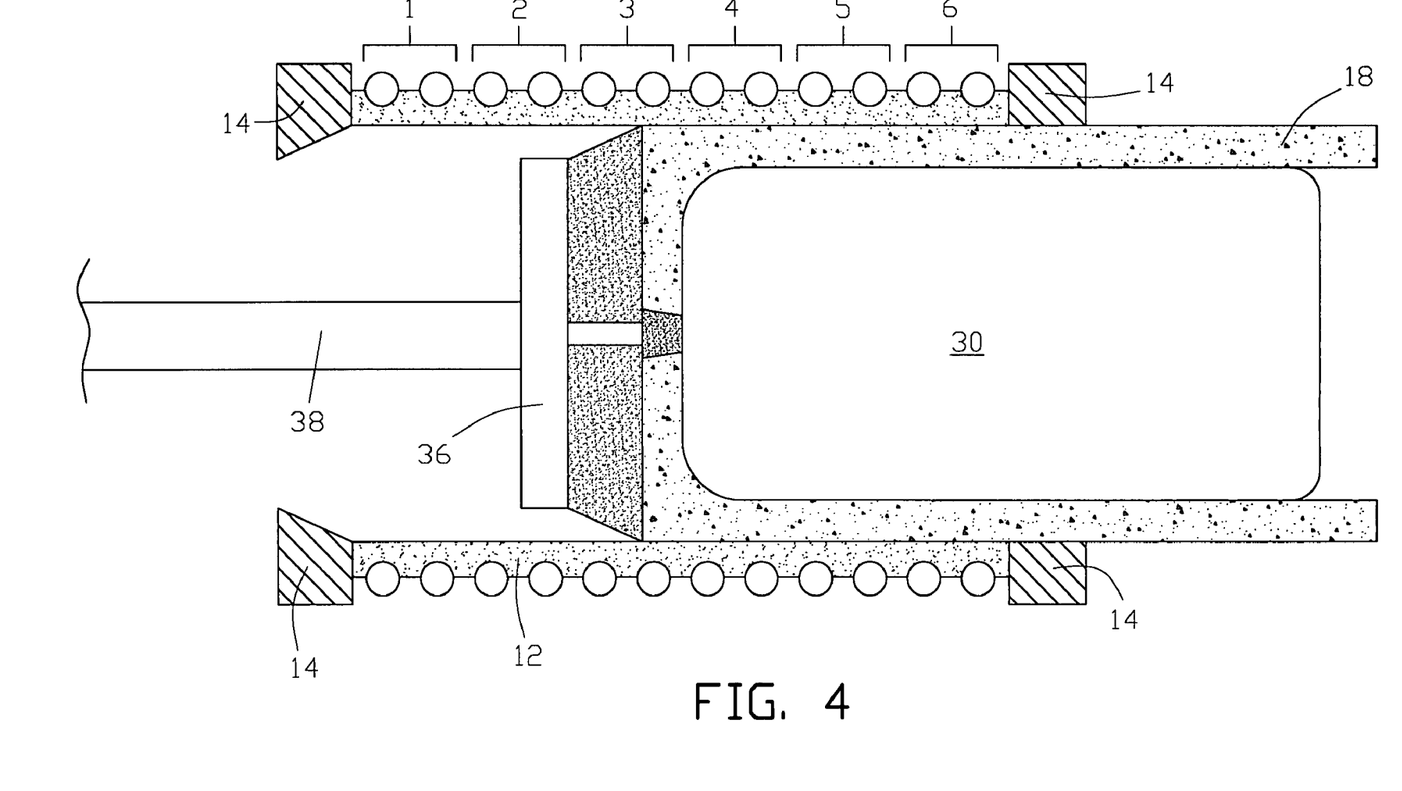
FIG. 4 illustrates push-out of a directionally solidified metal from a vessel used in a system for directional solidification of a metal of the present invention.

Once the entire molten mass is solidified, vessel 10 can be tilted with a suitable tilt mechanism, and a pushing means, such as pusher plate 36 connected to power driven cylinder 38 can be used to push solidified metal 30, along with surrounding refractory 18, out of the vessel. Further processing can include removal of the refractory from the solid metal and trimming the outer boundaries of the solidified metal that may contain impurities. The highly purified metal is then further processed, for example, if silicon, by sawing into thin wafers for use in making semiconductor components. Vessel 10 can be reused by repacking it with new refractory and sintering the refractory.

Figure 5:
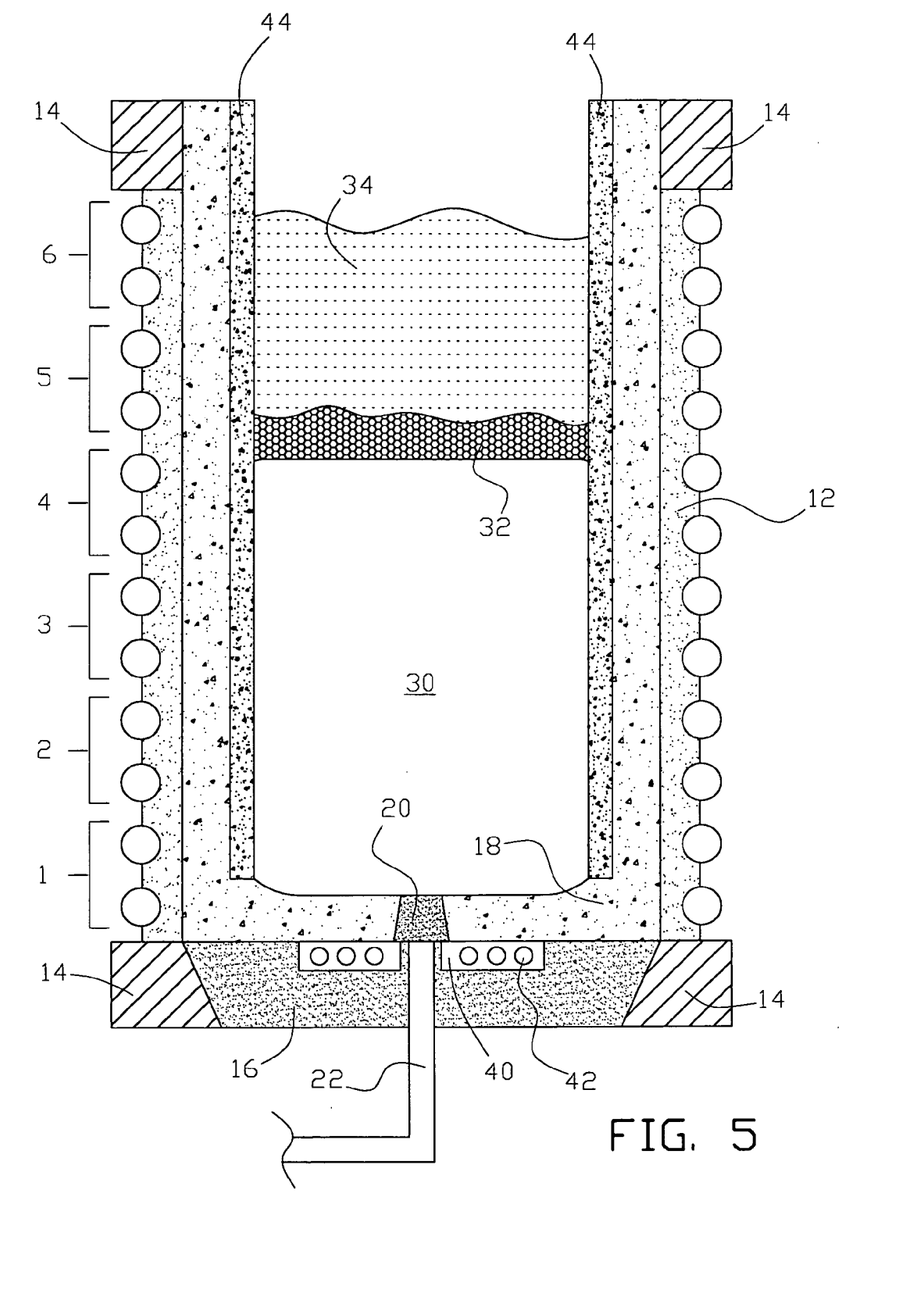
FIG. 5 illustrates one example of a system for directional solidification of a metal of the present invention wherein the vessel is magnetically coupled with the field produced by current flowing through induction coils surrounding the vessel.

Vessel 10 used in the above examples of the invention is a substantially non-electrically conductive vessel and the magnetic fields produced by the flow of currents in the induction coils are coupled with the molten mass in the vessel to inductively heat the melt. When the molten mass is a good electrical conductor, such as molten silicon, (75 $\Omega^{-1}$ $cm^{-1}$; as opposed to crystalline silicon's low conductivity value of 0.3 $\Omega^{-1}$ $cm^{-1}$) induction coupling directly with the molten metal to heat the melt works well. When the molten material is not a good electrical conductor, an electrically conductive susceptor, rather than the molten mass in the vessel, can be used for magnetic coupling with the produced magnetic fields as illustrated in FIG. 5. Susceptor 44 may be an aggregate electrically conductive material, such as an open ended cylinder sleeve formed from silicon carbide that is inserted into the vessel, or a composite electrically conductive material such as silicon carbide particles dispersed in non-electrically conductive refractory material. In other examples of the invention the susceptor may be otherwise integrated into the vessel to form a susceptor vessel. The thickness of the electrically conductive material should be at least one standard (induced eddy current) depth of penetration for maximum magnetic coupling with the applied magnetic fields. The depth of induced eddy current penetration into any material is dependent upon the frequency of the induced eddy current (applied field), and the electrical conductivity and magnetic permeability of the material. More specifically the depth of induced eddy current penetration (δ) is given by the equation:

$$\delta = 503(\rho/\mu F)^{1/2}$$

where ρ is the electrical resistivity of the material in Ωm; μ is the relative permeability of the material; and F is the frequency of the induced eddy current resulting from the applied field when one or more of induction coils 1 through 6 are powered from a power supply 24 with an output frequency F. One standard depth of penetration is the depth at which the eddy current density has decreased to 1/e (where e is Euler's constant, 2.718 . . . ).

In other examples of the invention a suitable sensor can be used to monitor the progress of the directional solidification. For example the sensor may direct electromagnetic waves of an appropriate wavelength into the melt so that the waves reflect back to the sensor at the molten metal/impurities interface, and/or the solid metal/impurities interface to monitor progress of the solidification. An output of the sensor that is proportional to the real time height of one or both of the above interfaces may be used to dynamically control the time-power management scheme for coil power switching.

Other coil arrangements are contemplated in the scope of the invention. For example, overlapping coils may be used to refine removal of heat from the molten mass in the vessel. Further the number of coils used in the above examples does not limit the scope of the invention. In some examples of the invention, air cooled induction coils may be used and separate cooling coils may be provided around the exterior of the vessel, or integrated into the vessel.

Other types of power supply and distribution arrangements are contemplated within the scope of the invention. For example each coil may be powered by an individual power supply, or separate power supplies may power individual groups of coils.

The examples of the invention include reference to specific electrical components. One skilled in the art may practice the invention by substituting components that are not necessarily of the same type but will create the desired conditions or accomplish the desired results of the invention. For example, single components may be substituted for multiple components or vice versa.

The foregoing examples do not limit the scope of the disclosed invention. The scope of the disclosed invention is further set forth in the appended claims.

The invention claimed is:

1. An apparatus for directional solidification of a metal comprising:
    a vessel for containing a molten mass of the metal;
    a plurality of induction coils surrounding the height of the exterior of the vessel;
    a switching means for each of the plurality of induction coils, each of the switching means having a first switch terminal and a second switch terminal, each of the first switch terminals exclusively connected to a first coil terminal of each of the plurality of induction coils;
    a single source of ac current having a first source terminal and a second source terminal, the first source terminal connected to all of the second switch terminals, the second source terminal connected to all of the second coil terminals; and
    a control means for selectively opening and closing each of the switching means to progressively decrease the induced heat from the bottom to the top of the molten mass of the metal in the vessel.

2. The apparatus of claim 1 further comprising a means for selectively cooling the molten mass of the metal in the vessel progressively from the bottom to the top of the molten mass of the metal in the vessel, the means for selectively cooling disposed exteriorly around the height of the vessel.

3. The apparatus of claim 2 wherein the means for selectively cooling comprises a cooling medium flowing in each of the plurality of induction coils.

4. The apparatus of claim 1 further comprising a means for cooling the molten mass of the metal in the vessel from the bottom of the molten mass.

5. The apparatus of claim 2 further comprising a means for cooling the molten mass of the metal in the vessel from the bottom of the molten mass.

6. The apparatus of claim 1 further comprising a means for pushing the solidified metal out of the vessel.

7. The apparatus of claim 1 further comprising a sensor means to sense the progress of solidification of the mass of molten metal from the bottom to the top of the vessel.

8. The apparatus of claim 1 further comprising a feedback means for adjusting the means for selectively applying ac current to each of the plurality of induction coils to control the progress of solidification of the mass of molten metal from the bottom to the top of the vessel.

9. A method of directional solidification of a molten mass of a metal comprising the steps of:
    placing the molten mass of the metal in a vessel surrounded with a plurality of inductions coils connected to a single ac power source;
    selectively switching an ac current to each of the plurality of induction coils from the single ac power source to heat the molten mass of the metal in the vessel; and
    progressively decreasing the applied heat by induction from the bottom to the top of the molten mass of the metal in the vessel to solidify the molten mass in the vessel from the bottom to the top of the vessel.

10. The method of claim 9 further comprising the step of progressively cooling the molten mass of the metal in the vessel from the bottom to the top of the molten mass of the metal in the vessel.

11. The method of claim 9 further comprising the step of pushing the solidified metal out of the vessel.

12. An apparatus for directional solidification of a metal comprising:
    a susceptor vessel for containing a molten mass of the metal;
    a plurality of induction coils surrounding the height of the exterior of the susceptor vessel;
    a switching means for each of the plurality of induction coils, each of the switching means having a first switch terminal and a second switch terminal, each of the first switch terminals exclusively connected to a first coil terminal of each of the plurality of induction coils;
    a single source of ac current having a first source terminal and a second source terminal, the first source terminal connected to all of the second switch terminals, the second source terminal connected to all of the second coil terminals; and
    a control means for selectively opening and closing each of the switching means to progressively decrease the induced heat from the bottom to the top of the molten mass of the metal in the vessel.

13. The apparatus of claim 12 further comprising a means for selectively cooling the molten mass of the metal in the vessel progressively from the bottom to the top of the molten mass of the metal in the vessel, the means for selectively cooling disposed exteriorly around the height of the vessel.

14. The apparatus of claim 13 wherein the means for selectively cooling comprises a cooling medium flowing in each of the plurality of induction coils.

15. The apparatus of claim 12 further comprising a means for cooling the molten mass of the metal in the vessel from the bottom of the molten mass.

16. The apparatus of claim 13 further comprising a means for cooling the molten mass of the metal in the vessel from the bottom of the molten mass.

17. The apparatus of claim 12 further comprising a means for pushing the solidified metal out of the vessel.

18. The apparatus of claim 12 further comprising a sensor means to sense the progress of solidification of the mass of molten metal from the bottom to the top of the vessel.

19. The apparatus of claim 12 further comprising a feedback means for adjusting the means for selectively applying ac current to each of the plurality of induction coils to control the progress of solidification of the mass of molten metal from the bottom to the top of the vessel.

20. A method of directional solidification of a molten mass of a metal comprising the steps of:
- placing the molten mass of the metal in a susceptor vessel surrounded with a plurality of inductions coils connected to a single ac power source;
- selectively switching an ac current to each of the plurality of induction coils from the single ac power source to heat the susceptor vessel to heat by conduction and radiation the molten mass of the metal in the susceptor vessel; and
- progressively decreasing the applied heat by induction from the bottom to the top of the susceptor vessel to solidify the molten mass in the susceptor vessel from the bottom to the top of the vessel.

21. The method of claim 20 further comprising the step of progressively cooling the molten mass of the metal in the susceptor vessel from the bottom to the top of the molten mass of the metal in the vessel.

22. The method of claim 20 further comprising the step of pushing the solidified metal out of the vessel.

* * * * *